United States Patent
Shen et al.

(10) Patent No.: US 10,839,190 B2
(45) Date of Patent: Nov. 17, 2020

(54) GATE DRIVER FOR A FINGERPRINT SENSOR

(71) Applicant: FINGERPRINT CARDS AB, Gothenburg (SE)

(72) Inventors: Guozhong Shen, San Jose, CA (US); Ozan Ersan Erdogan, San Jose, CA (US)

(73) Assignee: FINGERPRINT CARDS AB, Gothenburg (SE)

( * ) Notice: Subject to any disclaimer, the term of this patent is extended or adjusted under 35 U.S.C. 154(b) by 0 days.

(21) Appl. No.: 16/368,741

(22) Filed: Mar. 28, 2019

(65) Prior Publication Data

US 2019/0318147 A1    Oct. 17, 2019

Related U.S. Application Data

(60) Provisional application No. 62/658,381, filed on Apr. 16, 2018.

(51) Int. Cl.
*G06K 9/00* (2006.01)
*H03K 3/356* (2006.01)
*G01D 5/24* (2006.01)

(52) U.S. Cl.
CPC ......... *G06K 9/0002* (2013.01); *G01D 5/2405* (2013.01); *H03K 3/356026* (2013.01)

(58) Field of Classification Search
CPC .............. G06K 9/0002; G01D 5/2405; G09G 2310/0286; G06F 21/32; G06F 2203/0338; H03K 5/15093
See application file for complete search history.

(56) References Cited

U.S. PATENT DOCUMENTS

| | | | | |
|---|---|---|---|---|
| 4,851,743 A * | 7/1989 | Schmerda | ............ | H02H 7/0833 388/811 |
| 5,627,841 A * | 5/1997 | Nakamura | ..... | G01R 31/318586 714/731 |
| 5,838,172 A * | 11/1998 | Ito | ........................... | H04L 7/033 327/20 |
| 10,417,363 B1 * | 9/2019 | Kaur | ............... | G01R 31/318541 |
| 10,541,280 B1 * | 1/2020 | Krah | ..................... | H01L 27/323 |
| 2003/0156105 A1 * | 8/2003 | Yokomichi | ............ | H04N 5/343 345/204 |
| 2008/0231605 A1 * | 9/2008 | Yang | ........................ | G06F 3/044 345/173 |
| 2012/0199724 A1 * | 8/2012 | Nomura | .................. | H04N 5/378 250/208.1 |
| 2012/0268422 A1 * | 10/2012 | Hirakawa | ............. | G06F 1/3203 345/174 |

(Continued)

*Primary Examiner* — Antonio Xavier
(74) *Attorney, Agent, or Firm* — RMCK Law Group, PLC

(57) ABSTRACT

An example gate driver for an array of sensing pixels is disclosed. The gate driver includes a first flip-flop including a first data input and a first data output. The first data output is coupled to a first group of sensing pixels of the array. The gate driver also includes a second flip-flop including a second data input and a second data output. The second data output is coupled to a second group of sensing pixels of the array. The gate driver further includes a first insertion circuit configured to receive a first start signal and to cause, based on the first start signal, the second flip-flop to drive the second group of sensing pixels without the first flip-flop driving the first group of sensing pixels for a scan of the array.

11 Claims, 13 Drawing Sheets

(56) References Cited

U.S. PATENT DOCUMENTS

| | | | |
|---|---|---|---|
| 2013/0166978 A1* | 6/2013 | Itozawa | G01R 31/318544 |
| | | | 714/727 |
| 2014/0333328 A1* | 11/2014 | Nelson | G06F 3/041 |
| | | | 324/663 |
| 2016/0063230 A1* | 3/2016 | Alten | G06F 3/04883 |
| | | | 726/28 |
| 2016/0178409 A1* | 6/2016 | Tsutsui | H02J 1/00 |
| | | | 702/189 |
| 2017/0017340 A1* | 1/2017 | Liu | G09G 3/3648 |
| 2018/0004353 A1* | 1/2018 | Shin | G06F 3/044 |
| 2018/0039817 A1* | 2/2018 | Romera Jolliff | H04L 63/0861 |
| 2018/0164915 A1* | 6/2018 | Karpin | G06K 9/22 |

* cited by examiner

GATE DRIVER FOR A FINGERPRINT SENSOR

CROSS-REFERENCE TO RELATED APPLICATION

This application claims priority and benefit under 35 USC § 119(e) to U.S. Provisional Patent Application No. 62/658,381, filed on Apr. 16, 2018 and titled "TFT FINGERPRINT SENSOR," which is incorporated herein by reference in its entirety.

TECHNICAL FIELD

The present embodiments relate generally to touch sensors, and specifically to a gate line driver for a fingerprint sensor.

BACKGROUND

Many devices (such as smartphones, tablets, or other personal or mobile computing devices) include a fingerprint sensor. The fingerprint sensor may be separate from or integrated into a display panel. A fingerprint sensor typically includes an array of sensor or sensing elements arranged in rows and columns. Each column of sensing elements is coupled to a respective gate line, and each row of sensing elements is coupled to a respective read-out line. Each gate line (coupling a column of sensing elements) is coupled to a gate driver, and each read-out line (coupling a row of sensing elements) is coupled to a read-out circuit.

In conventional gate driver implementations, the gate driver is a serial-in serial-out (SISO) shift register, and each flip-flop of the shift register is configured to drive a corresponding column of sensing elements. The gate driver sequentially drives columns of sensing elements from a first column to a last column of the array of sensing elements. A driven column of sensing elements provides voltages indicating whether a touch exists at the location of the sensing region corresponding to each sensing element of the column. The sensing elements for the driven column provide the voltages to the read-out circuit via the read-out lines. In this manner, the fingerprint sensor sweeps through the entire sensing region in attempting to capture a fingerprint. As a result, the time required for scanning is related to the size of the sensing region for the fingerprint sensor.

The size of the sensing region for fingerprint sensors continues to grow. For example, with fingerprint sensors integrated into display panels for devices, a user may be unsure where the fingerprint sensing region is located on the display. Therefore, device manufacturers may desire the fingerprint sensor's sensing region to cover a large area of the display (e.g., the bottom 25 percent of a smartphone display). Additionally, fingerprint sensors with large sensing regions may be capable of multiple finger scanning (such as for dual-finger authentication). However, increased areas to scan increase the time needed for scanning. Additionally, the scan images are larger, which require more storage and processing resources than smaller scan images. As a result, increased latency negatively impacts a user's experience.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

An example gate driver for an array of sensing pixels is disclosed. The gate driver includes a first flip-flop including a first data input and a first data output. The first data output is coupled to a first group of sensing pixels of the array. The gate driver also includes a second flip-flop including a second data input and a second data output. The second data output is coupled to a second group of sensing pixels of the array. The gate driver further includes a first insertion circuit configured to receive a first start signal and to cause, based on the first start signal, the second flip-flop to drive the second group of sensing pixels without the first flip-flop driving the first group of sensing pixels for a scan of the array.

An example sensor is also described. The sensor includes an array of sensing pixels configured to sense a touch for a sensing region of the sensor and a gate driver configured to drive a portion of the array of sensing pixels in performing a scan by the sensor. The gate driver includes a first flip-flop including a first data input and a first data output. The first data output is coupled to a first group of sensing pixels of the array. The gate driver also includes a second flip-flop including a second data input and a second data output. The second data output is coupled to a second group of sensing pixels of the array. The gate driver further includes a first insertion circuit configured to receive a first start signal and to cause, based on the first start signal, the second flip-flop to drive the second group of sensing pixels without the first flip-flop driving the first group of sensing pixels for a scan of the array. The sensor also includes a controller configured to control the gate driver to drive the portion of the array in performing the scan.

An example method of operating a gate driver for an array of sensing pixels is disclosed. The method includes determining a portion of the array of sensing pixels corresponding to one or more touches in a sensing region of a sensor, driving the sensing pixels of the array in the portion for a scan by the sensor, and preventing sensing pixels of the array outside the portion from being driven.

BRIEF DESCRIPTION OF THE DRAWINGS

The present embodiments are illustrated by way of example and are not intended to be limited by the figures of the accompanying drawings.

DETAILED DESCRIPTION

Figure 1:
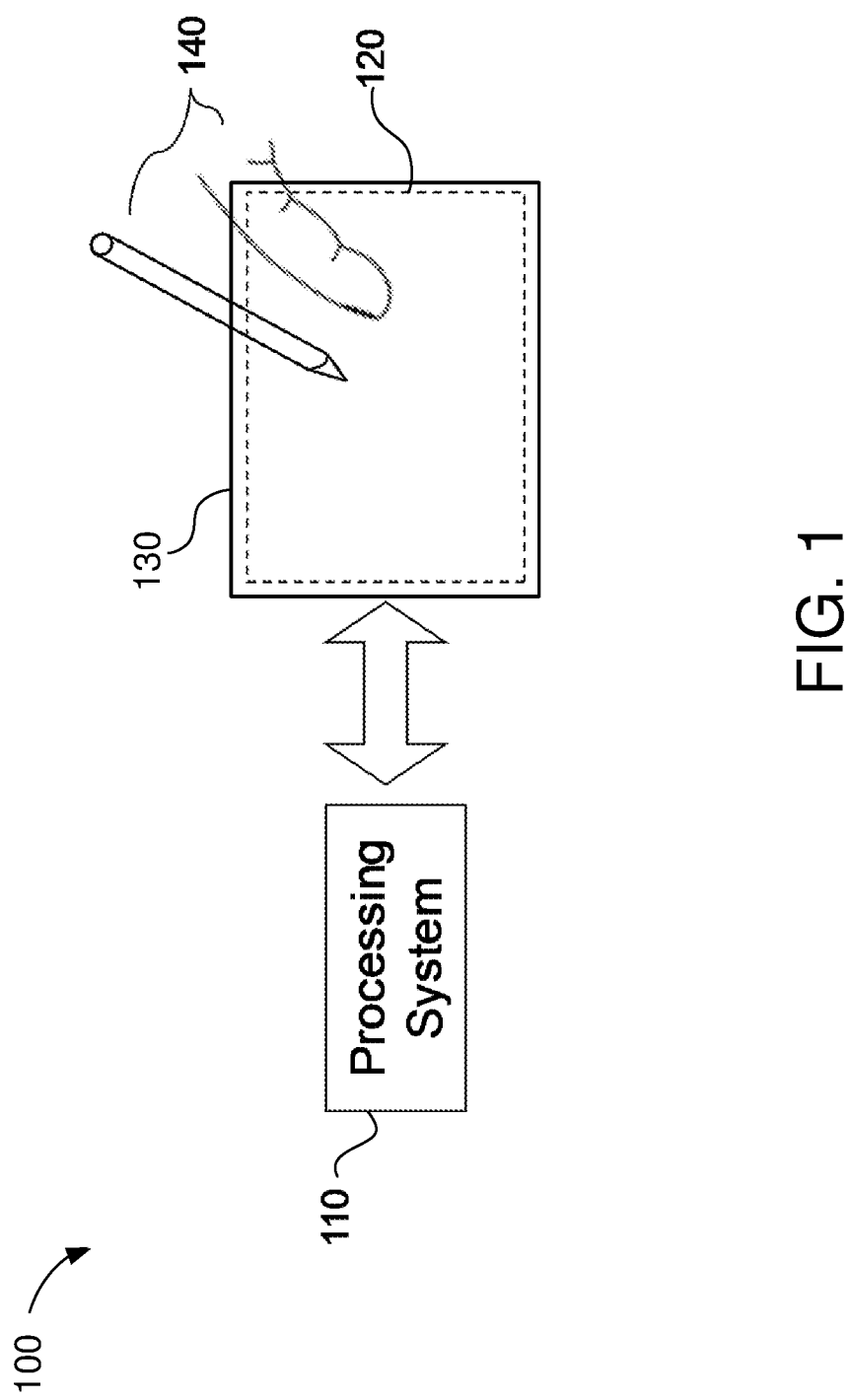
FIG. 1 illustrates a block diagram of an example device for which the present embodiments may be implemented.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory. The interconnection between circuit elements or software blocks may be shown as buses or as single signal lines. Each of the buses may alternatively be a single signal line, and each of the single signal lines may alternatively be buses, and a single line or bus may represent any one or more of a myriad of physical or logical mechanisms for communication between components.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory computer-readable storage medium comprising instructions that, when executed, performs one or more of the methods described above. The non-transitory computer-readable storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory.

Turning now to the figures, FIG. 1 is a block diagram of an example device 100, in accordance with some embodiments. The input device 100 may be configured to provide input to an electronic system (not shown). As used in this document, the term "electronic system" (or "electronic device") broadly refers to any system capable of electronically processing information. Some non-limiting examples of electronic systems or devices include computing systems, such as personal computers of all sizes and shapes (e.g., desktop computers, laptop computers, and netbook computers), tablets, smartphones, web browsers, e-book readers, and personal digital assistants (PDAs). Additional example computing systems include composite input devices, such as physical keyboards that include device 100 and separate joysticks or key switches. Further example computing systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smartphones), and media devices (including recorders, editors, and players such as televisions, set-top boxes, music players, digital photo frames, and digital cameras). Additionally, the electronic system could be a host or a slave to the device.

The device 100 may be implemented as a physical part of the electronic system, or may be physically separate from the electronic system. As appropriate, the device 100 may communicate with parts of the electronic system using, e.g., buses, networks, and other wired or wireless interconnections. Example technologies may include Inter-Integrated Circuit (I²C), Serial Peripheral Interface (SPI), PS/2, Universal Serial bus (USB), Bluetooth®, Infrared Data Association (IrDA), and various radio frequency (RF) communication protocols defined by the IEEE 502.11 standard.

The device 100 includes a processing system 110 and a display 130. The display 130 may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. For example, the display 130 may include an array of pixel elements (e.g., liquid crystal capacitors) coupled to a display gate driver and a display source driver (not shown for simplicity). Each row of pixel elements may be coupled to the display gate driver via a respective gate line. Each column of pixel elements may be coupled to the display source driver via a respective source line (or data line). The source driver may be configured to drive pixel data, via the source lines, onto the pixel elements of the array. The gate driver may be configured to select a particular row of pixel elements to receive the pixel data, for example, by driving the gate line coupled to the selected row. In some aspects, the display 130 may be updated by successively "scanning" the rows of pixel elements (e.g., one row at a time), until each row of pixel elements has been updated.

In some implementations, the device 100 may include or correspond to one or more position sensor devices. For example, the device 100 may include or be associated with a fingerprint sensor and proximity sensor configured to sense input provided by one or more input objects 140 in a sensing region 120. Example input objects 140 for interacting with the input device 100 include fingers and styli, as shown in FIG. 1. A fingerprint sensor may be a swipe sensor, where a fingerprint image is reconstructed from a series of scans as the user moves their finger over the sensor, or a placement sensor, where a sufficient area of the fingerprint can be captured from a single scan as the user holds a finger at a fixed location in the sensing region 120.

Sensing region 120 may encompass any space above, around, in and/or near the device 100 (e.g., near at least a portion of the display 130) in which the device 100 is able to detect user input (e.g., user input provided by one or more input objects 140). The sizes, shapes, and locations of particular sensing regions may vary widely from embodiment to embodiment. In some embodiments, the sensing region 120 extends from a surface of the device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the device 100, contact with an input surface (e.g. a touch surface or display) of the device 100, contact with an input surface of the device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100. In some other embodiments, the sensing region 120 has a circular shape that conforms to the shape of a fingertip. However, the sensing region 120 may have any suitable shape and dimensions. While the sensing region 120 is illustrated as overlapping at least a portion of an active area of a display 130, the sensing region 120 may be at any suitable location of the device 100 (e.g., to the side of the display 130, on a surface of the device 100 on which the display 130 is not disposed, etc.). In some other implementations, the device 100 may not include a display 130 but include a fingerprint sensor and proximity sensor (e.g., a touchpad).

For sensing, the device 100 may include substantially transparent sensor electrodes overlaying the display screen and provide a touch screen interface for the associated electronic system. As another example, the device 100 may comprise photosensors in or under the display screen and provide an optical sensing interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Touch sensors (e.g., the proximity sensor and fingerprint sensor) and the display screen may share physical elements. For example, some embodiments may utilize some of the same electrical components for displaying and sensing.

In some capacitive implementations for input, voltage or current is applied to create an electric field. Nearby input objects cause changes in the electric field, and produce detectable changes in capacitive coupling that may be detected as changes in voltage, current, or the like. Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. An input object near the sensor electrodes alters the electric field near the sensor electrodes, thus changing the measured capacitive coupling. In some examples, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. An input object near the sensor electrodes alters the electric field between the sensor electrodes, thus changing the measured capacitive coupling. In some examples, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In some optical implementations for input, one or more optical detector elements (or "sensing elements" or "sensing pixels") are included for imaging an input object or detecting user input. The sensing pixels detect light from the sensing region 120. In various embodiments, the detected light may be reflected from input objects in the sensing region, emitted by input objects in the sensing region, transmitted through input objects in the sensing region, or some combination thereof. Example sensing pixels include photodiodes, phototransistors, a portion of a CMOS image sensor arrays, a portion of a CCD arrays, and/or any other sensor components capable of detecting wavelengths of light in the visible, infrared, and/or the ultraviolet spectrum. Some optical implementations utilize a light source (e.g., one or more LEDs) to provide illumination to the sensing region. Light reflected or scattered from the sensing region in the illumination wavelength(s) can be detected to determine input information corresponding to the input object.

In some other implementations, the device 100 may utilize other various sensing technologies to detect user input. Other example sensing technologies may include elastic, resistive, inductive, magnetic, acoustic, and ultrasonic sensing technologies. The devices 100 and 100A may include additional input components that are operated by the processing system 110 or by some other processing system. These additional input components may provide redundant functionality for input in the sensing region 120, or some other functionality.

In FIG. 1, a processing system 110 is shown as part of the device 100. The processing system 110 may be configured to operate the hardware of the device 100 to detect input in the sensing region 120. In some embodiments, the processing system 110 may be implemented as a set of modules that are implemented in firmware, software, or a combination thereof. Example modules include hardware operation modules for operating hardware such as sensor electrodes and display screens; data processing modules for processing data such as sensor signals and positional information; and reporting modules for reporting information. In some embodiments, the processing system 110 may include sensor operation modules configured to operate sensing elements to detect user input in the sensing region 120; identification modules configured to identify gestures such as mode changing gestures; and mode changing modules for changing operation modes of the device 100 and/or the electronic system.

The processing system 110 may comprise parts of or all of one or more integrated circuits (ICs) and/or other circuitry components. For example, a processing system for a sensor may comprise transmitter circuitry configured to transmit signals with transmitter sensor electrodes and/or receiver circuitry configured to receive signals with receiver sensor electrodes.

In some implementations, the processing system 110 may include electronically-readable instructions, such as firmware and/or software. In some implementations, components of the processing system 110 are located together, such as near sensing element(s) of the device 100. In some other implementations, components of processing system 110 are physically separate from the sensing element(s). For example, the device 100 may be a peripheral coupled to a desktop computer, and the processing system 110 may comprise software configured to run on a central processing unit of the desktop computer and one or more ICs (perhaps with associated firmware) separate from the central processing unit. As another example, the device 100 may be physically integrated in smartphones, and the processing system 110 may comprise circuits and firmware that are part of a processor of the respective smartphone. The processing system 110 may be dedicated to controlling the devices 100 and 100A, or the processing system 110 may also perform other functions, such as operating the display 130, driving haptic actuators, etc.

The processing system 110 may respond to a user input (or lack of user input) in the sensing region 120 by causing one or more actions. Example actions include changing operation modes (e.g., unlocking the user device or providing access to secure data using a detected fingerprint), as well as graphical user interface (GUI) actions such as cursor movement, selection, menu navigation, and other functions. For example, the processing system 110 may provide information about the input (or lack of input) to some part of the electronic system (e.g., to a central processing system of the electronic system that is separate from the processing system), and the part of the electronic system processes information received from the processing system 110 to act on the user input (or lack of user input), such as to facilitate a full range of actions, including mode changing actions and GUI actions. In some implementations, the processing system 110 may be configured to concurrently drive display electrodes to update at least a portion of the display 130 and sense user inputs in the sensing region 120.

The processing system 110 may operate the sensing element(s) of the device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and so on.

"Positional information" as used herein broadly encompasses absolute position, relative position, velocity, acceleration, and other types of spatial information. Example "zero-dimensional" positional information includes near/far or contact/no contact information. Example "one-dimensional" positional information includes positions along an axis. Example "two-dimensional" positional information includes motions in a plane. Example "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

It should be understood that while many embodiments of the technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
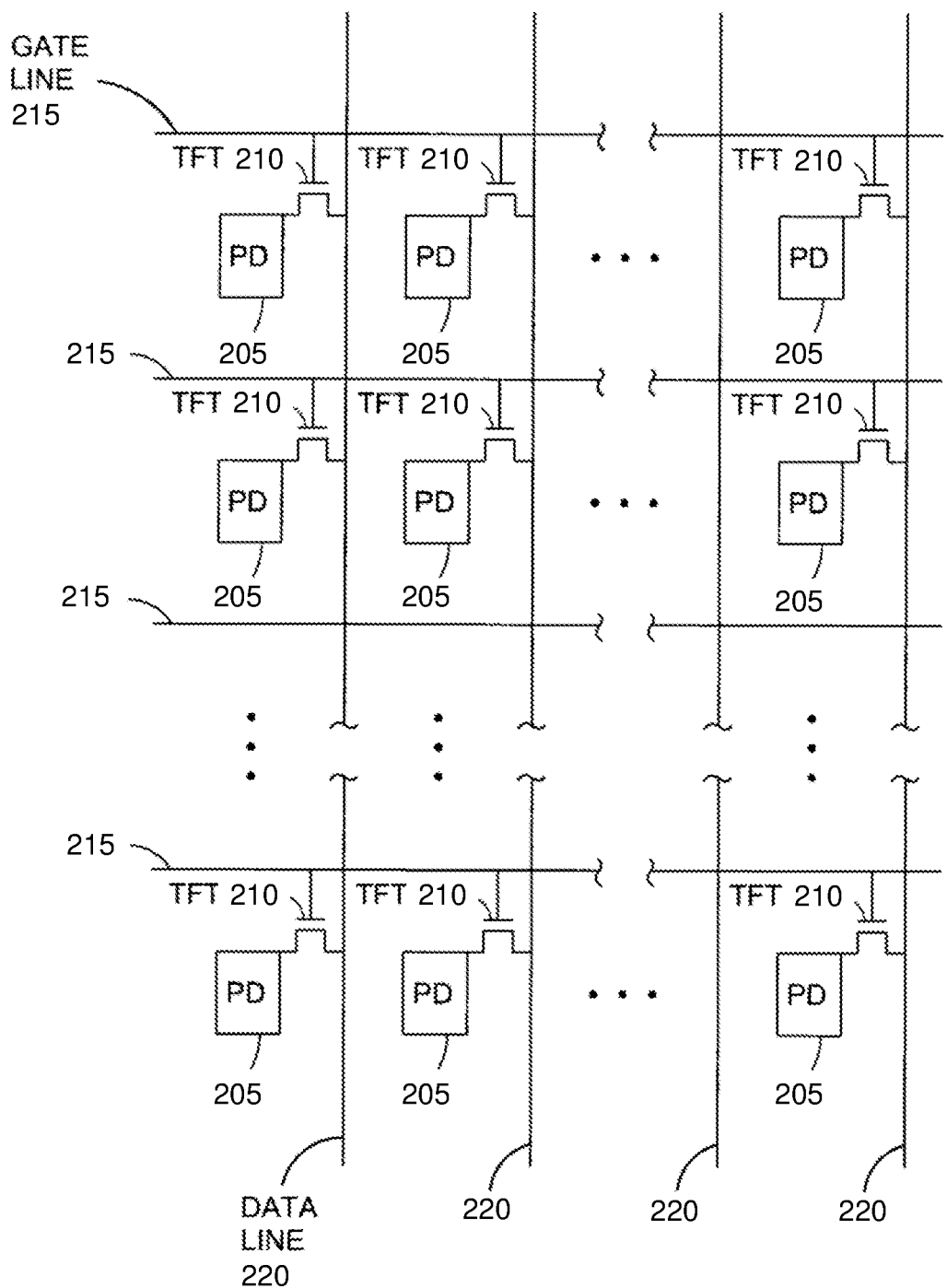
FIG. 2 illustrates an optical pixel array in an optical fingerprint sensor.
Figure 3:
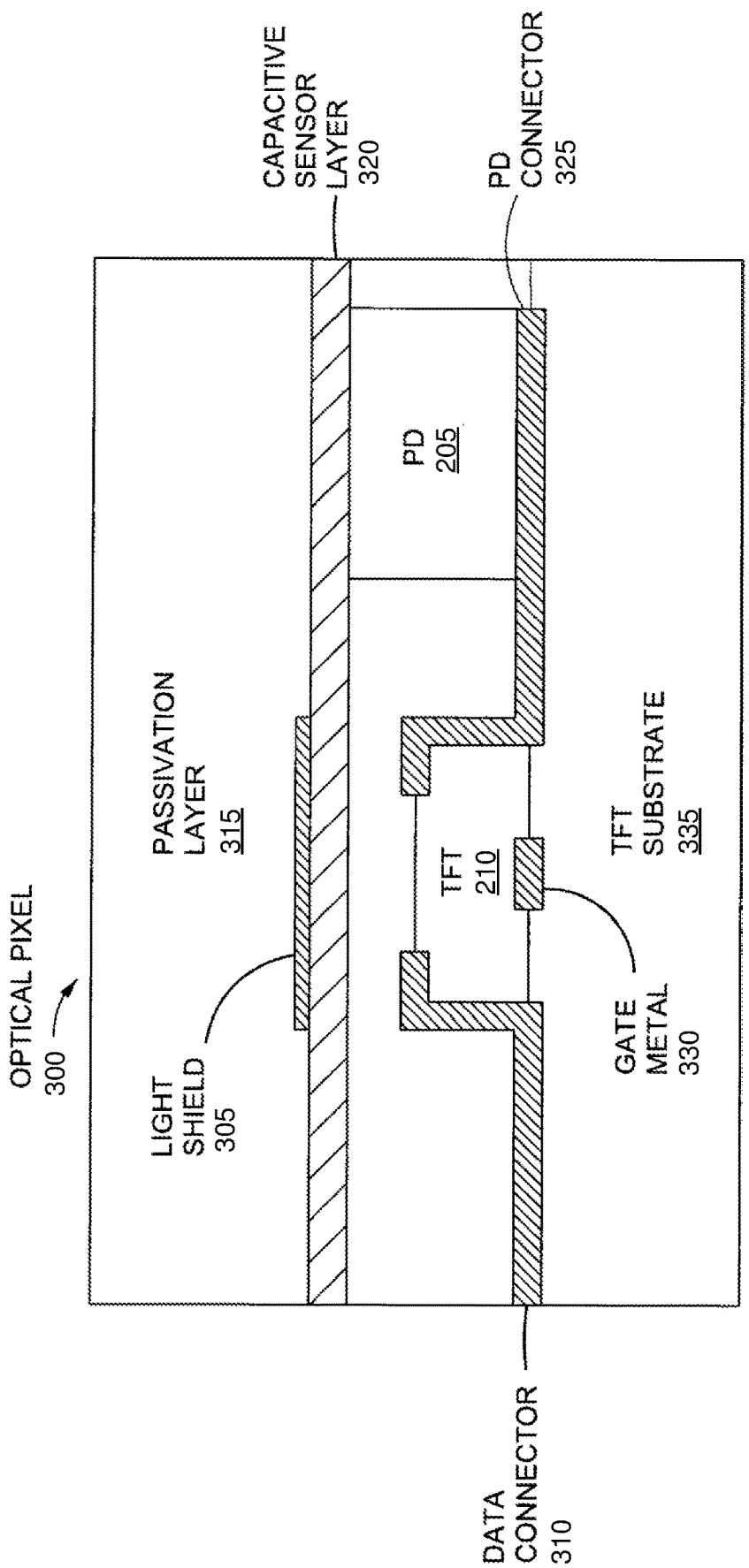
FIG. 3 illustrates an optical pixel.

As noted above, the device 100 may use optical sensing technologies to sense a touch. FIGS. 2-3 are regarding example optical sensing technology which may be used in a device or computing system to sense a touch in a sensing region of the device or computing system. FIGS. 2-3 are described below in reference to the device 100 in FIG. 1 for illustrative purposes. However, the input device 100 is only an example device. Any other suitable devices or computing systems may be used, and the present disclosure is not limited to the provided examples.

FIG. 2 illustrates an optical pixel array 200 in an optical fingerprint sensor. The optical pixel array 200 includes a plurality of sensing pixels, which may include photodiodes (PDs) 205 arranged into a rectangular matrix array which are coupled to data lines 220 using a respective thin-film transistor (TFT) 210. The TFTs 210 include gates that are coupled to respective gate lines 215. Each of the PDs 205 is connected to a data line 220 through a source and drain of the associated TFT 210. Driving different voltages on the gate lines 215 either activates (e.g., opens) or deactivates (e.g., closes) the TFTs 210. When activated, the TFTs 210 electrically couple the PDs 205 to the data lines 220. As described below, the data lines 220 can be used to pre-charge the PDs 205 and to measure voltages corresponding to the PDs 205 in order to capture a fingerprint for a human finger. When deactivated, the PDs 205 are electrically floating—i.e., are electrically disconnected for the data lines 220. Although not shown, each data line 220 may be coupled to a respective analog front end (AFE) (also called an optical AFE) which can measure charge, voltage, or currents corresponding to the PDs 205 to capture a fingerprint.

To use optical sensing to capture a fingerprint, one or more light sources (not shown in FIG. 2) may be included separate from or integrated within the optical pixel array 200, which emit light towards a sensing region where a finger is disposed. The light interacts with the finger (e.g., is reflected or scattered by the finger) and changes in the optical response due the interaction of the light with the finger are detected by the PDs 205. For example, the light reflected or scattered by the finger may be detected by the PDs. In one embodiment, the optical pixel array 200 includes gate driver circuitry which controls the voltages on the gate lines 215 in order to activate and deactivate the TFTs 210. In some embodiments, the gate driver circuitry includes a shift register which permits the optical fingerprint to raster through the rows. For example, when performing optical sensing, at any given time the device may couple only one row of the PDs 205 to the data lines 220 while the other rows of PDs 205 are disconnected from the data lines 220. The gate driver circuitry can use one of the gate lines 215 to activate all of the TFTs 210 coupled to the gate line 215 while driving voltages on the other gate lines 215 which deactivate the TFTs 210 in the remaining rows.

In one embodiment, the optical pixel array 200 connects a selected row of the PDs 205 to the data lines 220. The optical AFEs coupled to the data lines 220 pre-charge a capacitance corresponding to the PDs 205 in the selected row. After pre-charging the PDs 205 in the row, the gate line 215 deactivates the TFTs which disconnects the PDs 205 in the row from the data lines 220. While disconnected, one or more light sources emit light which interacts with the finger (if present) and at least a portion of the light is detected by the PDs 205 which changes a leakage current corresponding to the PDs 205 relative to a leakage current when no (or less) light strikes the PDs 205. The PDs 205 are then reconnected to the data lines 220 using the selected gate line 215 and the TFTs 210. The optical AFEs coupled to the data lines 220 then measure voltages corresponding to the PDs in the selected row. By measuring the voltage (or the change in the voltage), the input device can determine ridges and valleys in the finger in order to capture a fingerprint. However, this is just one example of performing optical sensing. The embodiments described herein can be used with other techniques for performing optical sensing to capture a fingerprint.

The optical pixel array 200 includes an area and a pitch suitable for capturing a fingerprint (e.g., a full or partial fingerprint area sufficient for reliably performing fingerprint authentication). In one embodiment, the optical pixel array 200 includes an area ranging from 20 $mm^2$ to 100 $mm^2$. In one embodiment, the optical pixel array 200 includes a pitch of photodiodes ranging from 5 microns to 100 microns. Other dimensions may be suitable for the optical pixel array 200 in some implementations. Although photodiodes are specifically mentioned, the embodiments herein can apply to other types of photosensors such as a phototransistor.

Figure 4:
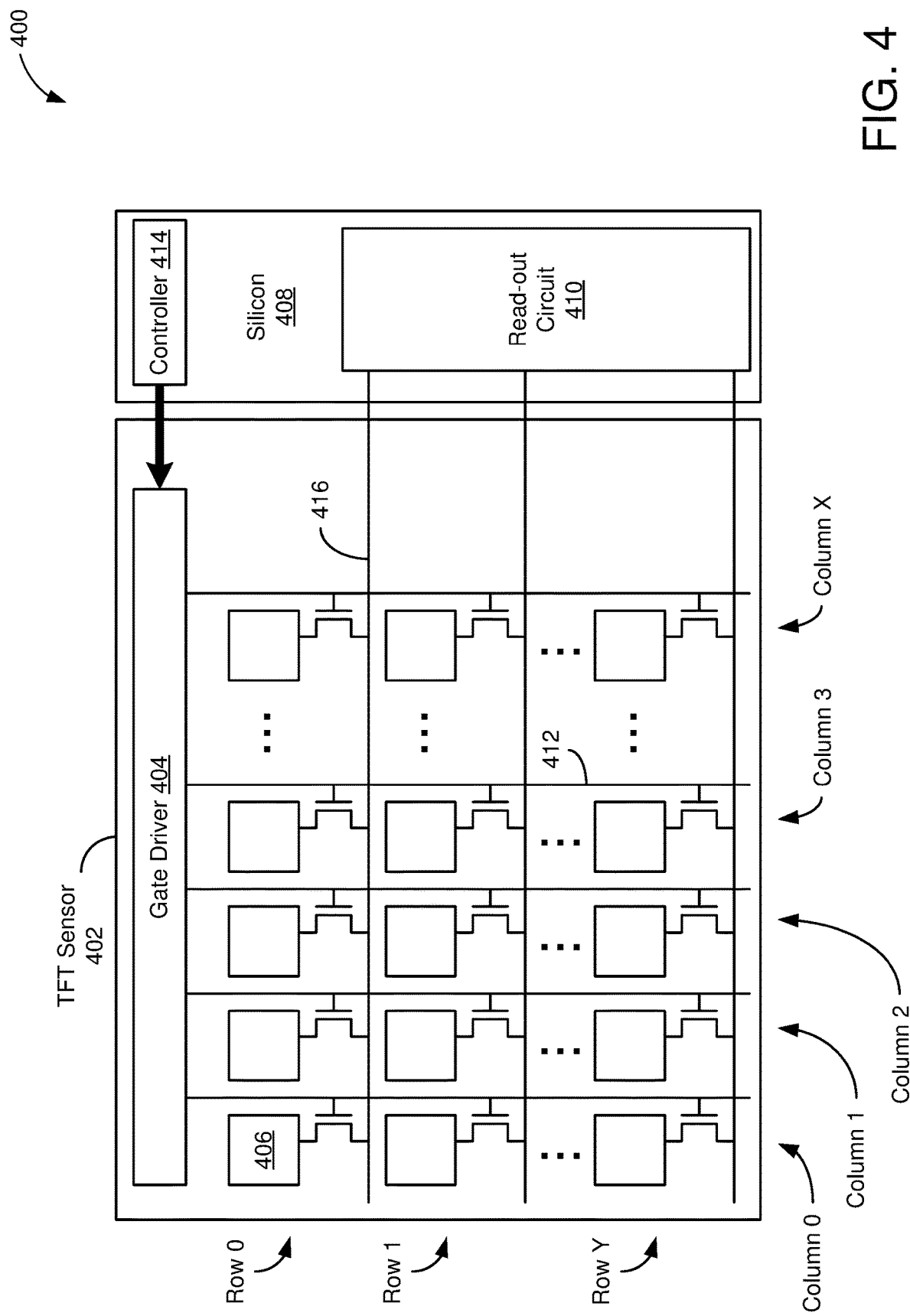
FIG. 4 illustrates a block diagram of a fingerprint sensor.

FIG. 3 illustrates an optical pixel 300. FIG. 3 may be a schematic cross-sectional view of one of the PDs 205 and TFTs 210 illustrated in FIG. 2, and the example in FIG. 3 illustrates the general electrical connections between the various components in the optical pixel 300. The particular spatial arrangement shown in FIG. 4 is an example and other arrangements are possible. The optical pixel 300 includes a TFT substrate 335 on which the TFT 210 (switch) and the PD 205 (photosensor) are disposed. In one embodiment, the TFT substrate 335 is made of glass. FIG. 3 is a simplified schematic to illustrate some functional components of the optical pixel 300 in a dual optical and capacitive sensor, but it should be understood that the optical pixel 300 can include various metal routing layers, insulation layers, and semiconductor layers disposed over the TFT substrate 335 in various configurations.

In the optical pixel 300, one terminal of the TFT 210 is coupled to a data connector 310 (e.g., data metal) which couples the TFT 210 to one of the data lines 220 shown in FIG. 2. Another terminal of the TFT 210 is coupled to a PD connector 325 which couples the TFT to the PD 205. A gate metal 330 is coupled to one of the gate lines 215 in FIG. 2 and controls a gate of the TFT 210 to form a conductive channel in the TFT 210. When formed, the conductive channel electrically connects the data connector 310 to the PD connector 325 to charge the PD 205 or to measure a voltage corresponding to the PD 205 as described above. In other words, the gate metal 330 can activate and deactivate the TFT 210 in order to selectively couple the data connector 310 to the PD connector 325.

In some implementations, the TFT 210 includes at least one doped active semiconductor layer (e.g., doped silicon) which can be used to form the conductive channel in response to the voltages driven on the gate metal 330. In one example, the TFT 210 includes amorphous silicon. Because the active structures in the TFT 210 can be affected by light, the optical pixel 300 may include a light shield 305 which blocks some or all of the light emitted when performing optical sensing (as well as ambient light) from striking the TFT 210. The light shield 305 may be formed of an opaque metal layer.

As shown, the bottom surface of the PD 205 (e.g., a first surface) is coupled to the PD connector 325 while a top, opposite surface of the PD 205 (e.g., a second surface) is coupled to a capacitive sensor layer 320. The capacitive sensor layer 320 may include one or more capacitive sensor electrodes. In one example, the capacitive sensor layer 320 includes a single capacitive sensor electrode (e.g., to detect a presence of a finger) which is connected to all of the PDs 205 in the optical pixel array. In another example, the capacitive sensor layer 320 includes a plurality of capacitive sensor electrodes arranged in a pattern having a lower resolution and/or lower sensor pitch between electrodes than the optical pixel array. One of the capacitive sensor electrodes may be electrically connected to multiple ones of the PDs 205 in the pixel array. In some implementations, the capacitive sensor layer 320 includes a plurality of capacitive sensor electrodes arranged in a pattern having the same resolution or sensor pitch between electrodes as the optical pixel array. Each of the capacitive sensor electrodes may be electrically connected to a respective one of the PDs 205 in the optical pixel array. When performing optical sensing, the capacitive sensor layer 320 is coupled to a reference or bias voltage (referred to herein as Vcom), and the capacitive sensor electrodes, which are electrically coupled to the PD 205, are held at a constant, unmodulated voltage. For capacitive sensing, the sensor electrodes in the capacitive sensor layer 320 may be driven with a capacitive sensing signal (e.g., an AC signal) in order to detect the presence or movement of an input object in the sensing region.

In some implementations, the sensing region 120 (FIG. 1) is the area above a top surface of the device (which may be a top surface of the passivation layer 315 or a top surface of an additional cover layer disposed above the passivation layer 315, such as a cover glass). By performing capacitive sensing using the capacitive sensor layer 320, the input device can determine when an input object is proximate to the optical pixel 300—i.e., when the input object is in the sensing region. In some implementations, the capacitive sensor layer 320 may be considered part of or included in the proximity sensor, while optical sensing components (including the PD 205) may be considered part of the fingerprint sensor.

An input object may not need to contact the input surface in order to be detected by the capacitive sensor layer 320, but can be hovering over the input surface. In some implementations, the input object is detected by the capacitive sensor layer 320 when it is in contact with the input surface over the PD 205. The term "touch" may refer to contact or close proximity to an input surface (such as "hovering").

The passivation layer 315 may be a dielectric material. Moreover, the passivation layer 315 and the capacitive sensor layer 320 may be formed from optically transparent material such that light from the sensing region can pass through these layers in order to reach the PD 205. In one embodiment, the capacitive sensor layer 320 is formed of a transparent conductor, such as indium tin oxide (ITO), which is optically transparent but also is conductive. In that way, the capacitive sensor layer 320 can be driven to Vcom during optical sensing (e.g., for fingerprint scanning) and can be driven with a capacitive sensing signal when the fingerprint performs capacitive sensing. In one embodiment, the capacitive sensor layer 320 may also be referred to as an ITO bias layer.

Conventional fingerprint sensors scan an entire sensing region for a fingerprint scan. For example, each column of an array of sensing pixels is driven to provide sensing values (such as a current indicating a presence/ridge or lack of presence/valley of an object/finger at the corresponding location) for each respective pixel. A fingerprint image may then be constructed from the sensing values.

FIG. 4 illustrates a block diagram of a fingerprint sensor 400. In some implementations, the fingerprint sensor 400 may be based on optical sensing and include components as illustrated in FIGS. 2 and 3. The example fingerprint sensor 400 includes a TFT sensor 402 coupled to silicon 408. The silicon 408 includes other components of the computing system. For example, a controller 414 may be implemented in the silicon 408 and configured to provide control signals to the gate driver 404 of the TFT sensor 402. The silicon 408 also includes a read-out circuit 410 configured to receive the sensing values provided by the TFT sensor 402. The sensing values may be used to construct a fingerprint image or otherwise be used to identify one or more fingerprints.

The TFT sensor 402 includes a gate driver 404 and an array of sensing pixels 406 coupled to the gate driver 404 via gate lines 412. The array is also coupled to the read-out circuit 410 via read-out lines 416. The example array includes rows 0-Y and columns 0-X of sensing pixels 406, with each sensing pixel associated with a specific row and column. For example, a sensing pixel 406 of a specific column of the array is coupled to the gate driver 404 via the corresponding gate line 412. The gate driver 404 is configured to drive the sensing pixel 406 by driving the corresponding gate line 412. The sensing pixel 406 is also coupled to the read-out circuit via the corresponding read-out line 416. The read-out circuit 410 is configured to receive the signal provided by the sensing pixel 406 when the sensing pixel 406 is driven by the gate driver 404.

The number of columns and rows of the array corresponds to the size of the sensing region of the fingerprint sensor. For example, a larger sensing region corresponds to an increase in the number of columns and/or rows of sensing pixels 406. If the number of columns increases, the number of gate lines 412 increases, and the logic of the gate driver 404 increases for driving the increased number of gate lines 412.

Figure 5:
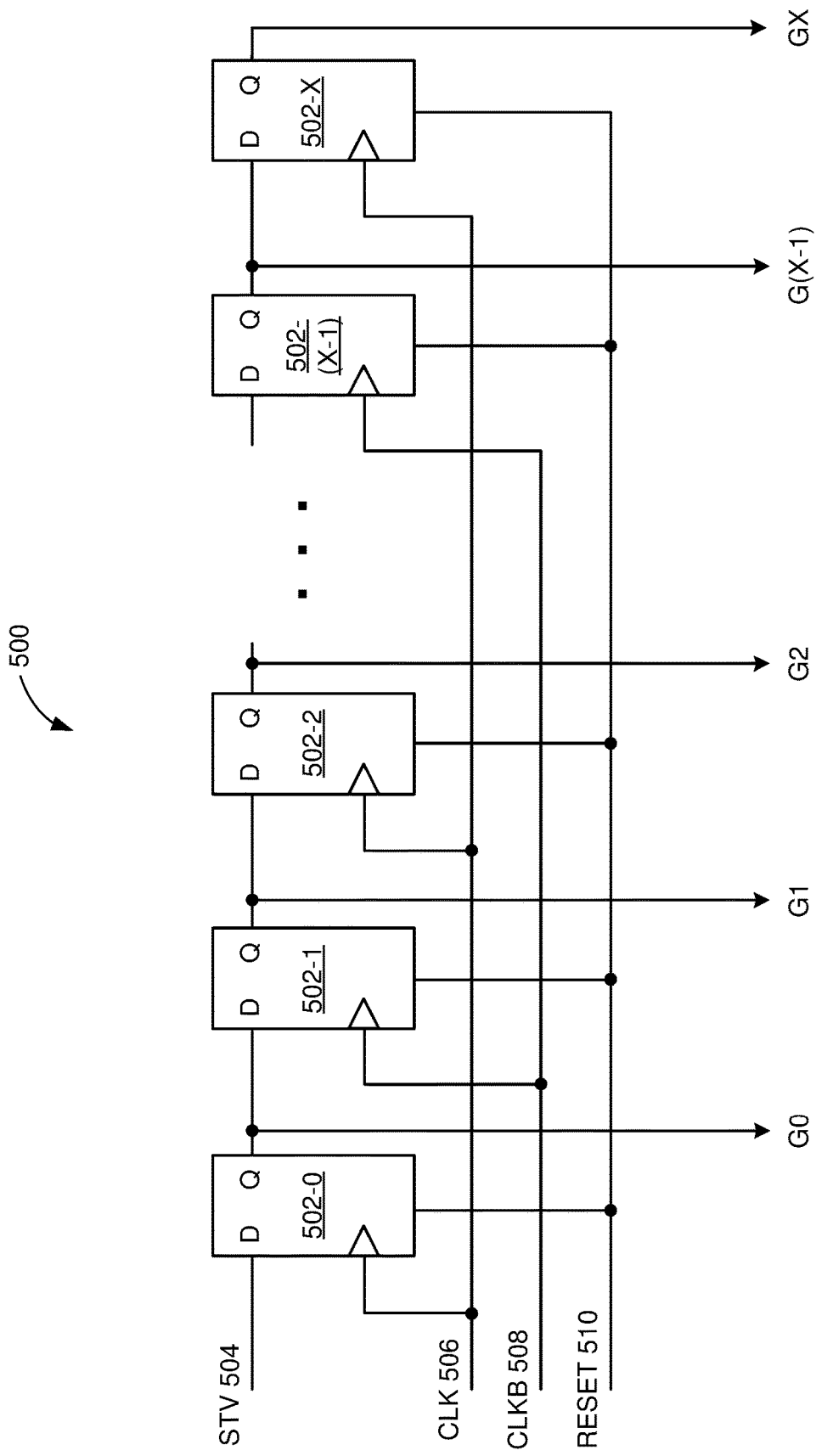
FIG. 5 illustrates a block diagram of a gate driver.

FIG. 5 illustrates a block diagram of a gate driver 500. The gate driver 500 may be a SISO shift register coupled to the gate lines of the array and configured to sequentially drive the gate lines. The gate driver 500 includes a plurality of flip-flops 502-0 through 502-X that are sequentially coupled, a start voltage (STV) line 504 coupled to the first flip-flop 502-0, a clock (CLK) line 506 coupled to alternating flip-flops, an inverse clock (CLKB) line 508 coupled to the other flip-flops, and a RESET line 510 coupled to each of the flip-flops. A signal on the STV line 504 may be provided by a controller (such as controller 414 in FIG. 4) to begin a fingerprint scan, with the clock and inverse clock signals (on lines CLK 506 and CLKB 508, respectively) controlling the timing of sequentially driving the corresponding gate lines. A flip-flop 502-0 through 502-X may drive a corresponding gate line by providing a high signal (a "1") on its output G0-GX, respectively. The RESET line 510 may be used to reset the gate driver 500. For example, when a fingerprint scan is complete (or if a fingerprint scan is to be terminated before completion), a controller (such as controller 414) may drive the RESET line 510 to 1 to reset the shift register (causing the outputs G0-GX to return to a low signal (a "0")).

Figure 6:
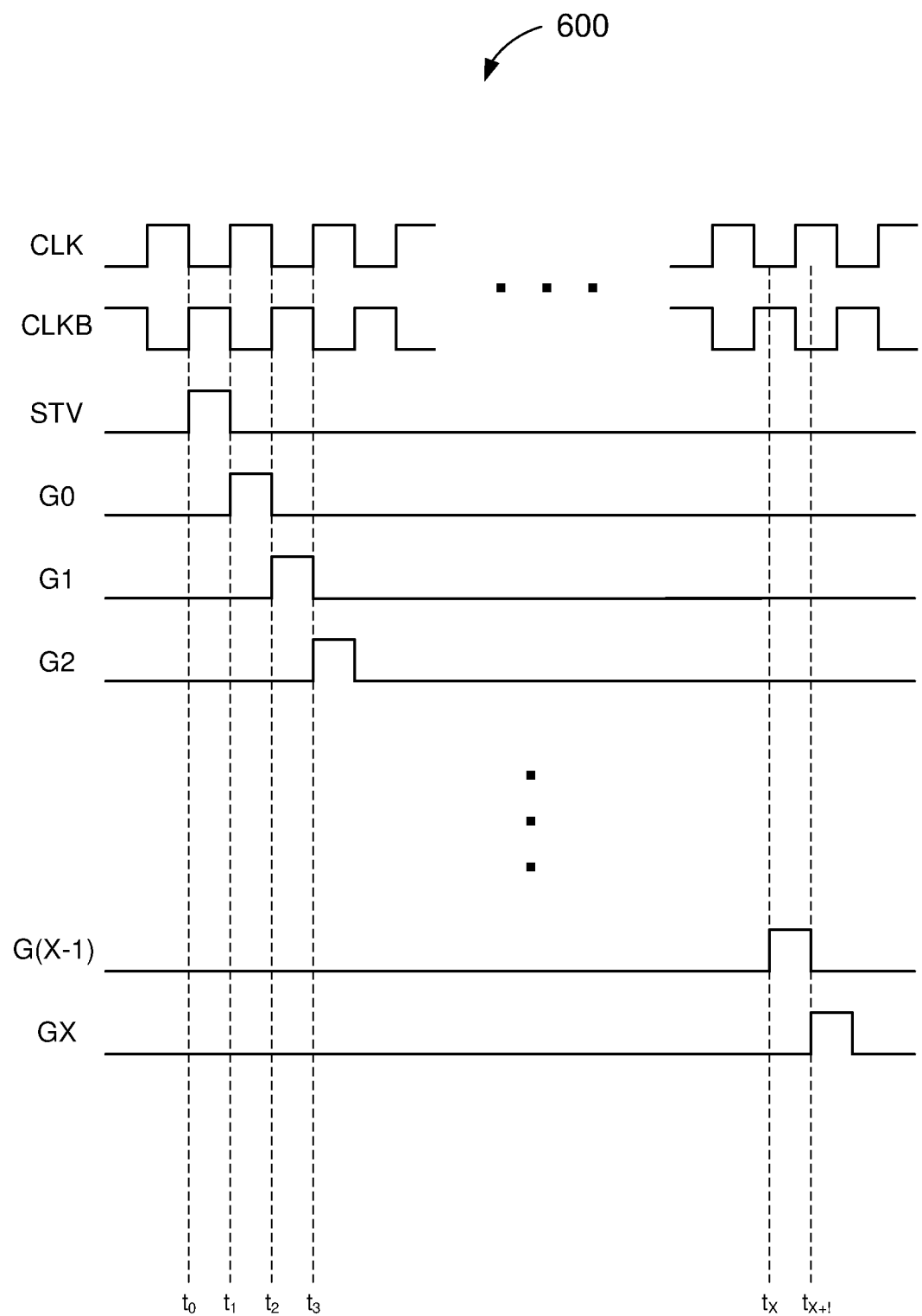
FIG. 6 is a timing diagram of the gate driver in FIG. 5.

FIG. 6 is a timing diagram 600 of the operation of the gate driver 500 in FIG. 5. With the clock signal (CLK) and inverse clock signal (CLKB) provided to the flip-flops, the STV signal of 1 provided at time $t_0$ to the flip-flop 502-0 may initialize the gate driver 500. As a result, the flip-flop 502-0 output G0 is driven to 1 at time $t_1$. Output G0 equal to 1 drives the first column (e.g., column 0) of the array of sensing pixels to provide sensing values to the read-out circuit.

With a 1 provided to the next flip-flop 502-1 at time $t_1$, output G1 from the flip-flop 502-1 is driven to 1; at time $t_2$. In this manner, the outputs G0 through GX are driven to 1 in sequence, causing the columns of the array of sensing pixels to be driven sequentially (e.g., G2 driven to 1 at $t_3$, G(X−1) driven to 1 at tx, and GX driven to 1 at $t_{x+1}$). The reset signal may be provided after $t_{x+1}$ when scanning of the sensing region is complete (not shown).

As sensing regions of fingerprint sensors increase in size, a gate driver to sequentially drive each column of sensing elements or pixels may cause an increase in the time to perform a fingerprint scan. In some implementations, a fingerprint sensor may be configured to scan only a portion of the sensing region. For example, the fingerprint sensor may include a gate driver configured to drive only a portion of the sensing pixels for a fingerprint scan. In this manner, the fingerprint sensor may reduce the time for performing a fingerprint scan.

Figure 7:
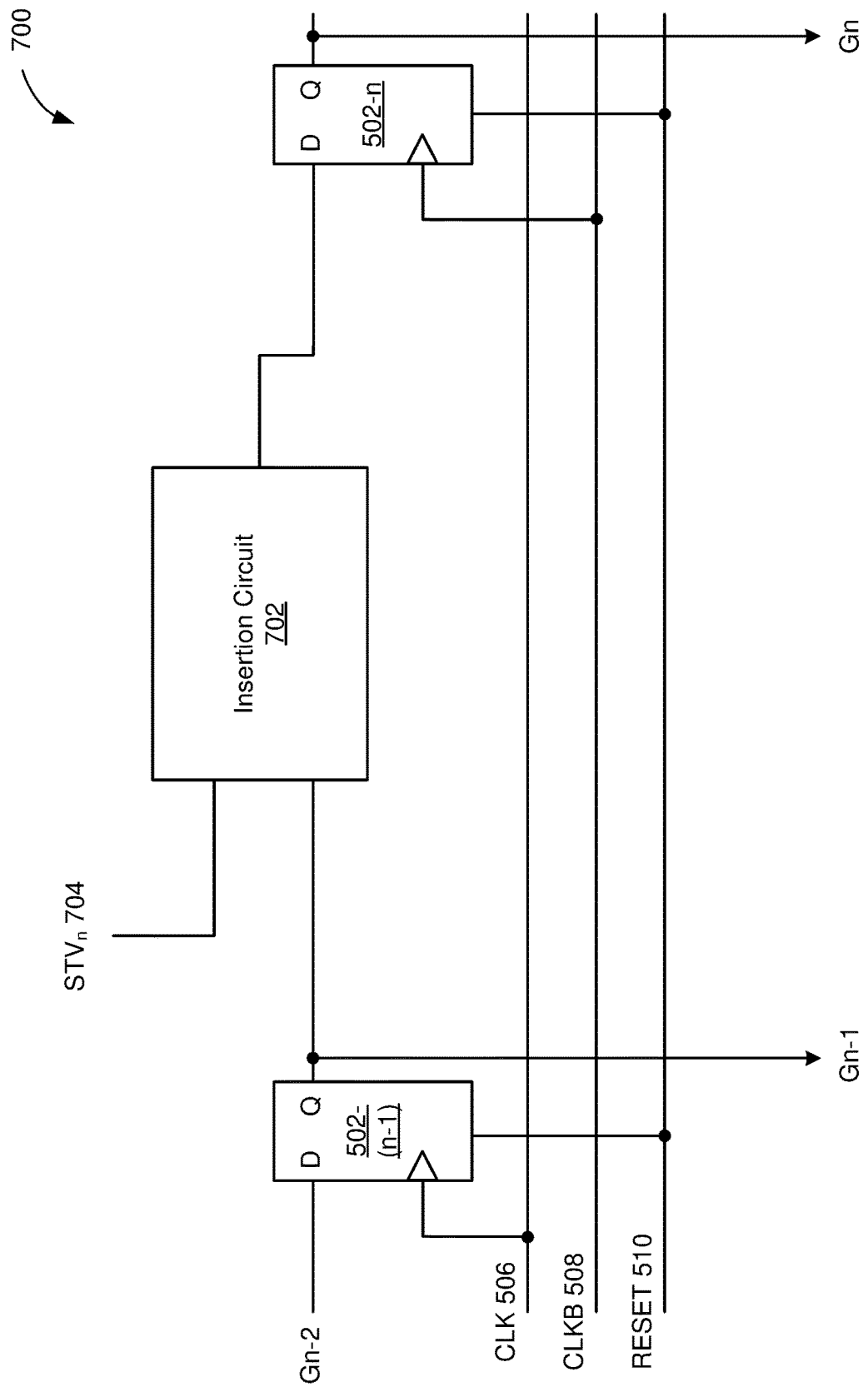
FIG. 7 illustrates a portion of the gate driver in FIG. 5 including an insertion circuit for beginning scanning.

FIG. 7 illustrates a portion 700 of the gate driver 500 in FIG. 5, including insertion circuit 702 for beginning scanning by driving output Gn to 1. As shown, the data input D of the flip-flop 502-$n$ is coupled to insertion circuit 702, which is configured to control whether scanning should begin at column n of the array of sensing pixels. In some implementations, a controller (such as controller 414) that determines the scan should begin at column n may drive $STV_n$ signal 704 to 1. Insertion circuit 702 is configured to initialize the gate driver 500 by providing the 1 to the data input D of the flip-flop 502-$n$. If the controller determines that the scan is to begin at a column before column n of the array, a different STV signal may be driven to 1 (such as on STV line 504 to begin scanning with column 0 of the array or a different STV line for a separate insertion circuit). In this manner, output Gn-1 is driven to 1, which is provided to the insertion circuit 702. Insertion circuit 702 may be further configured to provide the 1 to the data input D of the flip-flop 502-$n$ to continue the fingerprint scan.

In some example implementations, each flip-flop of the gate driver may be coupled to an insertion circuit corresponding to the respective flip-flop. In this manner, the fingerprint sensor may begin a fingerprint scan at any column of the array. In some other example implementations, a subset of the flip-flops may be coupled to an insertion circuit corresponding to the respective flip-flop. For example, flip-flops spaced a predetermined number of flip-flops from one another may be coupled to a corresponding insertion circuit, and the remaining flip-flops may be as configured in FIG. 5 (without insertion circuit 702). The fingerprint scan may therefore begin at one of the columns driven by one of the flip-flops spaced the predetermined number of flip-flops apart.

Figure 8A:
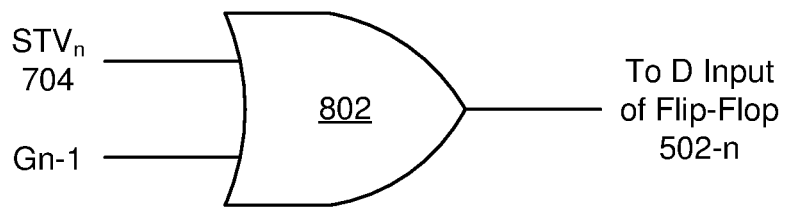
FIG. 8A illustrates a first example implementation of the insertion circuit in FIG. 7.
Figure 8B:
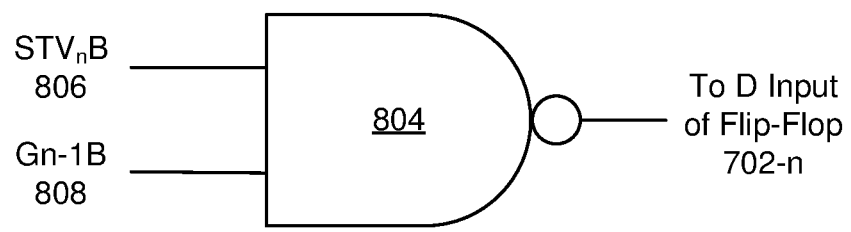
FIG. 8B illustrates a second example implementation of the insertion circuit in FIG. 7.

FIGS. 8A and 8B illustrate example implementations of the insertion circuit 702 in FIG. 7. As noted above, the insertion circuit 702 may be configured to provide a 1 to the flip-flop 502-$n$ when either the $STV_n$ signal 704 is 1 or the output Gn-1 from the flip-flop 502-($n$-1) is 1. In FIG. 8A, the insertion circuit 702 includes an OR gate 802 for OR'ing the $STV_n$ signal 704 and the output Gn-1. In FIG. 8B, the insertion circuit 702 includes a NAND gate 804. In the example, the inputs to the NAND gate 804 are the inverse of $STV_n$ signal 704 (STVnB 806) and the inverse of the output Gn-1 (Gn-1 B 808). In some implementations, the $STV_n$ signal 704 may be inverted before being provided to the NAND gate 804. For Gn-1 B 808, the flip-flop 502-($n$-1) may include an inverse output (e.g., Oft not shown) that may be coupled to the NAND gate 804. Alternatively, the output Gn-1 may be inverted before being provided to the NAND gate 804.

As noted above, the controller 414 may use the RESET line 510 to terminate a fingerprint scan before one or more columns of the array of sensing pixels are driven. In this manner, the fingerprint sensor may scan only a portion of the sensing region for a fingerprint scan. For example, a fingerprint scan may begin after a first column of the array (by using insertion circuit 702 to start at column 502$n$), and the fingerprint scan may end before a last column of the array (by using the RESET line 510 to end at the column last driven by the gate driver 500).

A fingerprint sensor configured to scan only a portion of the sensing region may be configured for dual-fingerprint or multi-fingerprint scanning. In some implementations, multiple portions of the sensing region may be scanned for a fingerprint scan. For example, a gate driver 500 may sequentially drive a number (s) of columns of the array (e.g., corresponding with a first fingerprint), not drive a subsequent number (t) of columns, and drive a subsequent number (t) of columns (e.g., corresponding with a second fingerprint). Any number of portions and portions of any size of the array may be driven by the gate driver 500. Additionally, a single portion of the array may be driven for scanning multiple fingerprints, and the present disclosure is not limited to the provided examples.

Figure 9:
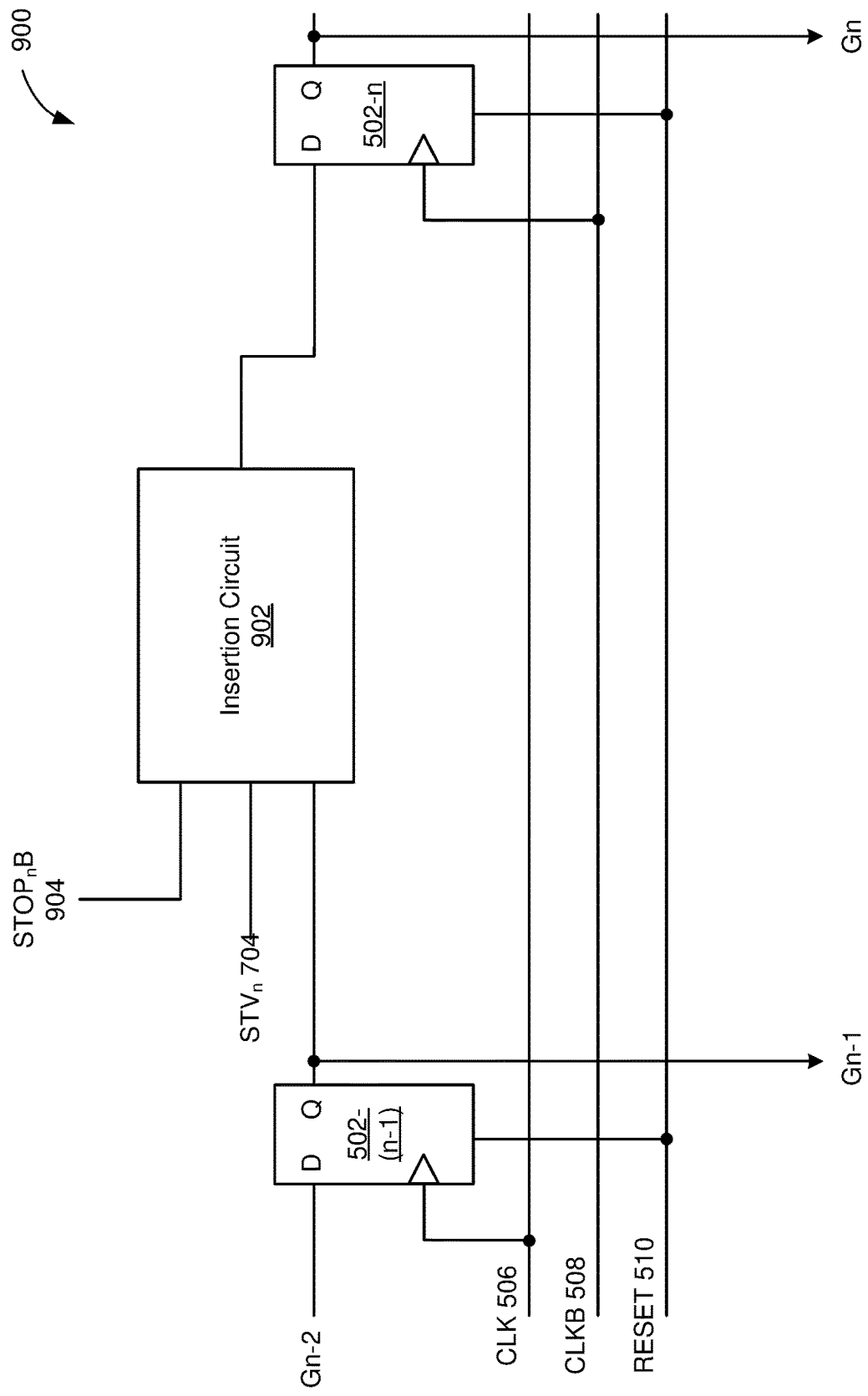
FIG. 9 illustrates a portion of the gate driver in FIG. 5 including an insertion circuit for beginning and stopping scanning.

FIG. 9 illustrates a portion 900 of the gate driver 500 in FIG. 5 including insertion circuit 902 for beginning and stopping scanning. In addition or alternative to a RESET line 510 being used, a stop signal $STOP_nB$ 904 may be provided by a controller to stop a scan. The portion 900 of the gate driver 500 includes flip-flops 502-($n$-1) and 502-$n$, and insertion circuit 902 coupled between the output Gn-1 from the flip-flop 502-($n$-1) and the D input for flip-flop 502-$n$. Insertion circuit 902 is configured to control whether scanning should begin at column n of the array of sensing pixels. In some implementations, the controller 414 that determines the scan should begin at column n may drive $STV_n$ signal 704 to 1. Insertion circuit 902 is configured to initialize the gate driver 500 by providing the 1 to the data input D of the flip-flop 502-$n$. If the controller 414 determines that the scan is to begin at a column before column n of the array, a different STV signal may be driven to 1. In this manner, output Gn-1 is driven to 1, which is provided to the insertion circuit 902. Insertion circuit 902 may be further configured to provide the 1 to the data input D of the flip-flop 502-$n$ to continue the fingerprint scan.

Insertion circuit 902 is also configured to control whether an existing scan should end at column n-1 of the array of sensing pixels. In some implementations, when the $STOP_nB$ signal 904 is 1, insertion circuit 902 operates similar to insertion circuit 702 in FIG. 7. When the $STOP_nB$ signal 904 is 0, the output of insertion circuit 902 is driven to 0, and the gate driver 500 is prevented from driving column n of the array of sensing pixels. In this manner, the controller 414 may drive the $STOP_nB$ signal 904 to 0 to cause the gate driver 500 to terminate scanning after driving column n-1 of the array of sensing pixels.

Figure 10A:
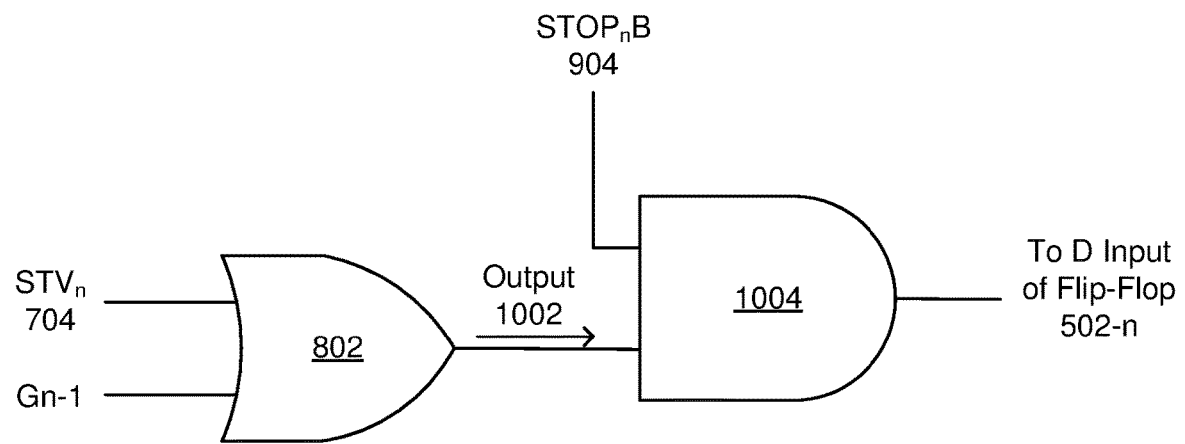
FIG. 10A illustrates a first example implementation of the circuit in FIG. 9.
Figure 10B:
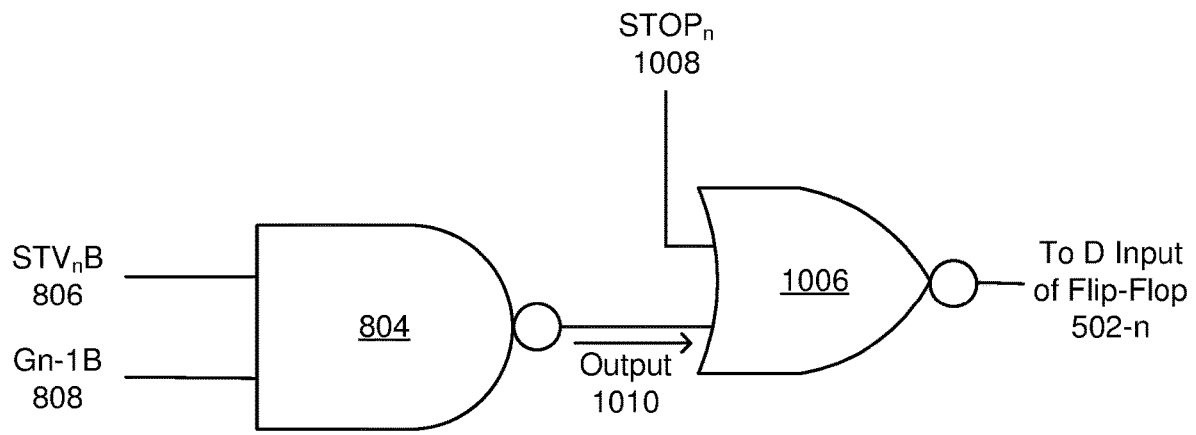
FIG. 10B illustrates a second example implementation of the circuit in FIG. 9.

FIGS. 10A and 10B illustrate example implementations of the insertion circuit 902 in FIG. 9. As noted above, the insertion circuit 902 may be configured to provide a 1 to the flip-flop 502-$n$ when either the $STV_n$ signal 704 is 1 or the output Gn-1 from the flip-flop 502-($n$-1) is 1 when $STOP_nB$ signal 904 remains 1. When $STOP_nB$ signal 904 is 0, the insertion circuit 902 may provide a 0 to the flip-flop 502-$n$ irrespective of $STV_n$ signal 704 and output Gn-1. In FIG. 10A, the insertion circuit 902 includes the OR gate 802 (FIG. 8A) and an AND gate 1004. The output 1002 of the OR gate 802 is an input to the AND gate 1004, with $STOP_nB$ signal 904 being the other input to the AND gate 1004. In this manner, the insertion circuit 902 outputs a 1 when $STOP_nB$ signal 904 is 1 and either $STV_n$ signal 704 or output Gn-1 is 1. In FIG. 10B, the insertion circuit 902 includes the NAND gate 804 (FIG. 8B) and a NOR gate 1006. The output 1010 of the NAND gate 804 is an input to the NOR gate 1006. Another input to the NOR gate 1006 is an inverse signal of $STOP_nB$ signal 904 ($STOP_n$ signal 1008). In this manner, the insertion circuit 902 outputs a 1 when $STOP_n$ signal 1008 is 0 and either $STV_n$ signal 704 or output Gn-1 is 1. In some implementations, the $STOP_nB$ signal 904 may be inverted before being provided to the NOR gate 1006. In some other implementations, a controller may provide STOP$_n$ signal 1008 without providing STOP$_n$B signal 904 to the insertion circuit 902.

In some implementations, the insertion circuit for starting a scan (and in some implementations, for stopping a scan) may exist for only a portion of the flip-flops of the gate driver 500. A number of flip-flops between such flip-flops may not include a corresponding insertion circuit for starting and/or stopping scanning. In one example, the insertion circuit may be disposed such that the flip-flops able to start and stop the scan are spaced a number of flip-flops apart. In some implementations, the number may be variable. For example, flip-flops with an insertion circuit may be more prevalent towards the middle of a sensing region (e.g., where a finger touch is more likely to occur). In some other implementations, the number may be constant. For example, insertion circuits may be uniformly disposed for the sensing region of the fingerprint sensor.

Figure 11:
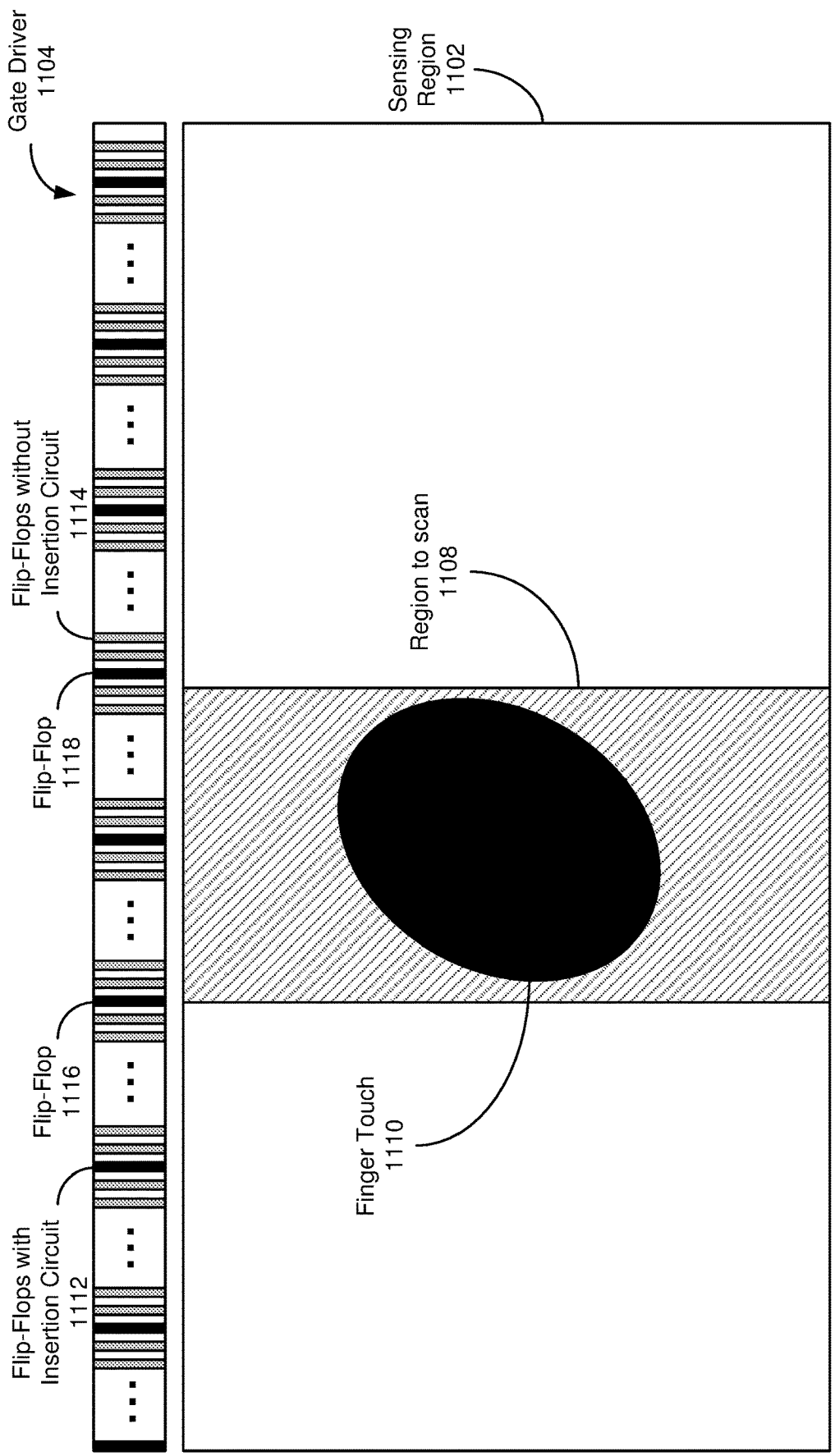
FIG. 11 illustrates an example sensing region of a fingerprint sensor.

FIG. 11 illustrates an example sensing region 1102 of a fingerprint sensor. The sensing region includes an array of sensing pixels, which may be coupled to the gate driver 1104. The gate driver 1104 in the illustrated example includes a first subset of flip-flops 1112 including or coupled to an insertion circuit and a second subset of flip-flops 1114 not including or coupled to an insertion circuit. The fingerprint sensor may begin scanning of the sensing region 1102 at a column of sensing pixels coupled to one of the first subset of flip-flops.

In one example for scanning a fingerprint for a finger touch 1110 in the sensing region 1102, the fingerprint sensor may scan the region 1108, which is only a portion of the entire scanning region 1102. The controller 414 may determine to begin scanning at the column of sensing pixels associated with flip-flop 1116 (which includes an insertion circuit). In this manner, the columns of sensing pixels associated with the first flip-flop through the flip-flop before flip-flop 1116 are not driven, and the associated portion of the sensing region 1102 is not scanned. After driving the column of sensing pixels associated with flip-flop 1116, the gate driver 1104 may continue to drive subsequent columns of the sensing pixels.

In some implementations, the scan may continue until the remaining columns of the sensing region 1102 are driven. In some other implementations, the controller 414 may also determine to terminate the scan at a column subsequent to the finger touch 1110. For example, the controller 414 may determine to prevent the gate driver 1104 from driving the column of sensing pixels associated with flip-flop 1118. If the insertion circuit for flip-flop 1118 is configured to also stop scans, the controller 414 may provide a signal to the insertion circuit for flip-flop 1118 to stop the scan. In this manner, the column of sensing pixels coupled to the flip-flop 1118 is not driven. Additionally, or alternatively, the controller 414 may determine to stop the scan at any column of sensing pixels (including columns associated with the second set of flip-flops 1114) through timing the reset signal to coincide with which column of sensing pixels should not be driven by the gate driver 1104.

While FIG. 11 illustrates one finger touch 1110, the fingerprint sensor may be configured to scan multiple fingerprints for concurrent finger touches in the sensing region 1102. For example, the fingerprint sensor may be configured for dual-fingerprint authentication where a user places two fingers concurrently on the fingerprint sensor in order to be identified by the computing system (such as the user's smartphone or personal computing device). The controller 414 may determine multiple places in the sensing region 1102 to start and stop scanning so that multiple regions similar to region 1108 may be scanned. The regions may be scanned in any order through the use of insertion circuits for different flip-flops of the gate driver 1104. In one example, the regions may be scanned in the order they appear in the sensing region 1102 in regards to the sequence of flip-flops for the gate driver 1104.

Figure 12:
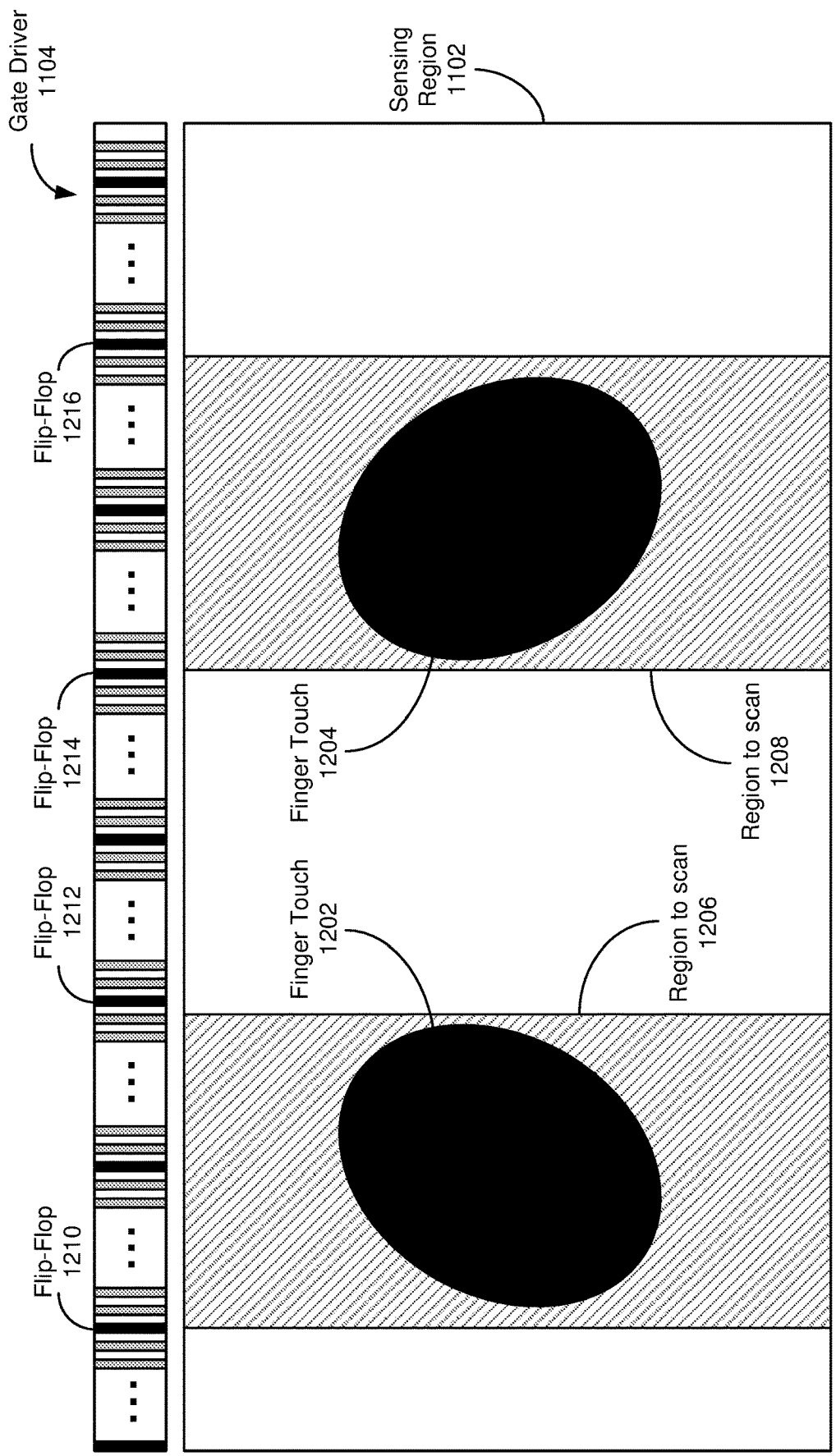
FIG. 12 illustrates the example sensing region in FIG. 11 with two finger touches.

FIG. 12 illustrates the example sensing region 1102 of a fingerprint sensor with two finger touches 1202 and 1204. In one example for scanning multiple fingerprints for finger touches 1202 and 1204 in the sensing region 1102, the fingerprint sensor may scan the region 1206 (for finger touch 1202) and the region 1208 (for finger touch 1204). For region 1206, the controller 414 may determine to begin scanning at the column of sensing pixels associated with flip-flop 1210 (which includes an insertion circuit). In this manner, the columns of sensing pixels associated with the first flip-flop through the flip-flop before flip-flop 1210 are not driven, and the associated portion of the sensing region 1102 is not scanned. After driving the column of sensing pixels associated with flip-flop 1210, the gate driver may continue to drive subsequent columns of the sensing pixels. In the example, the controller 414 may determine to prevent the gate driver 1404 from driving the column of sensing pixels associated with flip-flop 1212. If the insertion circuit for flip-flop 1212 is configured to also stop scans, the controller 414 may provide a signal to the insertion circuit for flip-flop 1212 to stop the scan. In this manner, the column of sensing pixels coupled to the flip-flop 1212 is not driven. Additionally, or alternatively, the controller 414 may determine to stop the scan through timing the reset signal.

The fingerprint sensor may scan region 1208 for a second fingerprint before or after scanning region 1206 for a first fingerprint. For region 1208, the controller 414 may determine to begin scanning at the column of sensing pixels associated with flip-flop 1214 (which includes an insertion circuit), and the controller 414 may determine to prevent the gate driver 1104 from driving the column of sensing pixels associated with flip-flop 1216. While scanning for two fingerprints are illustrated, the fingerprint sensor may be configured to scan for any suitable number of fingerprints.

The controller to control the fingerprint sensor (such as controller 414) may be included in or external to the fingerprint sensor. The controller 414 may be included in the processing system 110 as a processor executing software, dedicated circuitry, or other implementations of a controller. In determining which portions of the sensing region 1102 are to be scanned, the controller 414 may determine the approximate location(s) of the finger touch(es) in the sensing region 1102. In some example implementations of a computing system, a proximity sensor is configured to determine an approximate location of a touch in a sensing region of the fingerprint sensor. The proximity sensor may then provide the determined location to the controller 414 for the controller 414 to determine which portions of the sensing region are to be scanned. For example, the capacitive sensor layers of a proximity sensor may be used to sense objects at one or more locations in the sensing region 1102 to be scanned. The controller 414 may then control an optical scanning of those one or more locations in the sensing region 1102 to perform a fingerprint scan.

Figure 13:
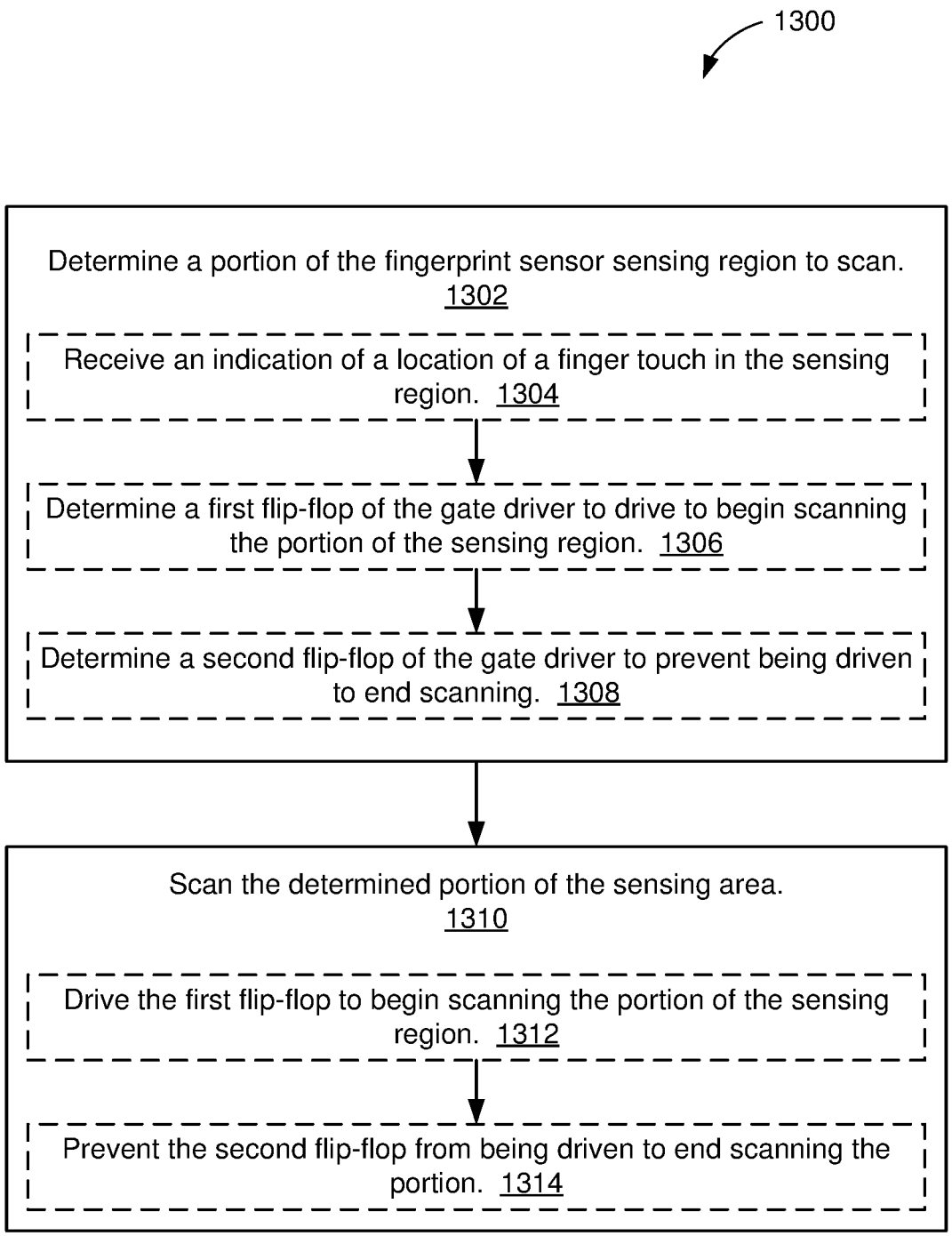
FIG. 13 is an illustrative flow chart for performing a fingerprint scan, in accordance with some implementations.

FIG. 13 is an illustrative flow chart of an example process 1300 for performing a fingerprint scan. Beginning at 1302, a computing system may determine a portion of the fingerprint sensor's sensing region to scan. In some example implementations, the controller 414 may receive from a proximity sensor an indication of a location of a finger touch in the sensing region (1304). The controller 414 may then determine, based on the location of the finger touch, a first flip-flop of the gate driver to drive to begin scanning the portion of the sensing region (1306). In some example implementations, the controller 414 may also determine, based on the location of the finger touch, a second flip-flop (subsequent to the first flip-flop) of the gate driver to prevent being driven to end scanning (1308). In some other example implementations, a second flip-flop is not determined, as scanning may be allowed to continue until the remainder of the scanning region associated with flip-flops subsequent to the first flip-flop of the gate driver is scanned.

The controller 414 may then control the fingerprint sensor to scan the determined portion of the fingerprint sensor (1310). If the first flip-flop to begin scanning is determined (1306), the controller 414 may drive the first flip-flop of the gate driver to begin scanning the portion of the sensing region (1312). For example, the controller 414 may provide a $STV_n$ signal 704 of 1 to insertion circuit 702 or 902 for the flip-flop 502-$n$ of gate driver 500 if determined to be the first flip-flop. As a result, the column of sensing pixels coupled to output Gn, and subsequent columns, are driven in sequence for scanning the portion of the sensing region.

If the second flip-flop to end scanning is determined (1308), the controller 414 may prevent the second flip-flop of the gate driver from being driven to end scanning the portion of the sensing region (1314). In one example, the controller 414 may provide a $STOP_nB$ signal 904 of 0 to insertion circuit 902 for the flip-flop 502-$n$ of gate driver 500 if determined to be the second flip-flop. As a result, the column of sensing pixels coupled to output Gn, and subsequent columns, are not driven, and the associated portion of the scanning region is not scanned. In another example, the controller 414 may provide a RESET 510 to all flip-flops of the gate driver 500, thus ending scanning.

Process 1300 may be repeated for multiple portions of the fingerprint sensor's sensing region to capture multiple fingerprints. For example, if the proximity sensor indicates that multiple touches are located in the sensing region, process 1300 may be performed for each touch in the sensing region.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. For example, while the provided examples are described regarding a fingerprint sensor, implementations also apply to other scanners including a gate driver for sequential scanning of a scanning region. Additionally, while the sensing region of a scanner is described as an array with columns and rows, any suitable configuration of the sensing elements may exist (e.g., radial patterns, arcs, diagonals, etc.), and the gate driver may be configured to drive suitable groups of sensing elements corresponding to their configuration. Further, while "touch" is used in describing sensing in a sensing region, "touch" may refer to an object in close proximity to a portion of the sensing region (such as a finger hovering over a fingerprint sensor), and the term "touch" does not require physical contact. Additionally, while the gate driver is described as being controlled by controller 414, any suitable means for controlling the gate driver may be used. For example, the gate driver may include the controller, or the gate driver may be controller by means external to the device or computing system including the fingerprint scanner. The specification and drawings are, accordingly, to be regarded in an illustrative sense rather than a restrictive sense.

What is claimed is:

1. A gate driver for an array of sensing pixels, the gate driver comprising:
   a first flip-flop including a first data input and a first data output, wherein the first data output is coupled to a first group of sensing pixels of the array; a second flip-flop including a second data input and a second data output, wherein the second data output is coupled to a second group of sensing pixels of the array; and
   a first insertion circuit configured to receive a first start signal and to cause, based on the first start signal, the second flip-flop to drive the second group of sensing pixels without the first flip-flop driving the first group of sensing pixels for a scan of the array,
   wherein:
   the first group of sensing pixels is a first column of sensing pixels in the array,
   the second group of sensing pixels is a second column of sensing pixels subsequent to the first column of sensing pixels in the array,
   the first insertion circuit is further configured to receive a first stop signal and to prevent, based on the first stop signal, the second flip-flop from driving the second column of sensing pixels after the first flip-flop drives the first column of sensing pixels, and
   the first insertion circuit further includes a logical OR gate and a logical AND gate, wherein:
   the logical OR gate is configured to perform an OR operation on the first start signal and the first data output from the first flip-flop and provide the result to the AND gate, and the logical AND gate is configured to perform an AND operation on the result from the OR gate and the first reset signal and provide the result to the second data input of the second flip-flop.

2. The gate driver of claim 1, wherein each flip-flop of the gate driver includes a RESET input to receive a reset signal to stop the scan.

3. The gate driver of claim 1, further comprising:
a third flip-flop including a third data input and a third data output, wherein the third data output is coupled to a third column of sensing pixels of the array;
a fourth flip-flop including a fourth data input and a fourth data output, wherein the fourth data output is coupled to a fourth column of sensing pixels of the array; and
a second insertion circuit configured to receive a second start signal and a second stop signal, the second insertion circuit being configured to:
cause, based on the second start signal, the fourth flip-flop to drive the fourth column of sensing pixels without the third flip-flop driving the third column of sensing pixels; and
prevent, based on the second stop signal, the fourth flip-flop from driving the fourth column of sensing pixels after the third flip-flop drives the third column of sensing pixels.

4. The gate driver of claim 1, further comprising:
a plurality of additional flip-flops in sequence, wherein the first flip-flop and the second flip-flop are in the sequence; and
a plurality of additional insertion circuitries, wherein an output of each of the plurality of additional insertion circuitries is coupled to a data input of a corresponding flip-flop of the plurality of additional flip-flops.

5. The gate driver of claim 4, wherein the number of insertion circuits is less than the number of flip-flops in sequence in the gate driver.

6. The gate driver of claim 5, wherein the array of sensing pixels is included in a fingerprint sensor.

7. A sensor, comprising:
an array of sensing pixels configured to sense a touch for a sensing region of the sensor;
a gate driver configured to drive a portion of the array of sensing pixels in performing a scan by the sensor, the gate driver including:
a first flip-flop including a first data input and a first data output, wherein the first data output is coupled to a first group of sensing pixels of the array; a second flip-flop including a second data input and a second data output, wherein the second data output is coupled to a second group of sensing pixels of the array; and
a first insertion circuit configured to receive a first start signal and to cause, based on the first start signal, the second flip-flop to drive the second group of sensing pixels without the first flip-flop driving the first group of sensing pixels for a scan of the array; and
a controller configured to control the gate driver to drive the portion of the array in performing the scan, wherein:
the first group of sensing pixels is a first column of sensing pixels in the array,
the second group of sensing pixels is a second column of sensing pixels subsequent to the first column of sensing pixels in the array,
the first insertion circuit is further configured to receive a first stop signal and to prevent, based on the first stop signal, the second flip-flop from driving the second column of sensing pixels after the first flip-flop drives the first column of sensing pixels, and
the first insertion circuit further includes a logical OR gate and a logical AND gate, wherein:
the logical OR gate is configured to perform an OR operation on the first start signal and the first data output from the first flip-flop and provide the result to the AND gate, and
the logical AND gate is configured to perform an AND operation on the result from the OR gate and the first reset signal and provide the result to the second data input of the second flip-flop.

8. The sensor of claim 7, wherein each flip-flop of the gate driver includes a RESET input to receive a reset signal to stop the scan.

9. The sensor of claim 7, wherein the gate driver further includes:
a third flip-flop including a third data input and a third data output, wherein the third data output is coupled to a third column of sensing pixels of the array;
a fourth flip-flop including a fourth data input and a fourth data output, wherein the fourth data output is coupled to a fourth column of sensing pixels of the array; and
a second insertion circuit configured to receive a second start signal and a second stop signal, the second insertion circuitry being configured to:
cause, based on the second start signal, the fourth flip-flop to drive the fourth column of sensing pixels without the third flip-flop driving the third column of sensing pixels; and
prevent, based on the second stop signal, the fourth flip-flop from driving the fourth column of sensing pixels after the third flip-flop drives the third column of sensing pixels.

10. The sensor of claim 7, wherein the sensor is a fingerprint sensor configured to scan multiple concurrent fingerprints during the scan.

11. The sensor of claim 10, wherein the controller is configured to receive one or more indications from a proximity sensor, wherein:
each indication is a location of a touch sensed by the proximity sensor in a sensing region of the fingerprint sensor; and
one or more non-overlapping portions of the array to be driven for a fingerprint scan correspond to the one or more sensed touches, wherein each of the one or more non-overlapping portions includes a plurality of neighboring columns of sensing pixels in the array.

* * * * *